United States Patent [19]

Potash

[11] 4,334,213

[45] Jun. 8, 1982

[54] CIRCUIT FOR ADDRESSING BINARILY ADDRESSABLE MEMORIES WITH BCD ADDRESSES

[75] Inventor: Hanan Potash, La Jolla, Calif.

[73] Assignee: Burroughs Corporation, Detroit, Mich.

[21] Appl. No.: 118,490

[22] Filed: Feb. 4, 1980

[51] Int. Cl.³ .................... H03K 13/24; G06F 5/02
[52] U.S. Cl. .............................. 340/347 DD; 235/311
[58] Field of Search .............................. 235/310, 311; 340/347 DD; 364/900

[56] References Cited

U.S. PATENT DOCUMENTS

| | | | |
|---|---|---|---|
| 3,160,872 | 12/1964 | Anderson | 340/347 DD |
| 3,170,062 | 2/1965 | Boese | 235/311 |
| 3,449,555 | 6/1969 | Wang | 340/347 DD |
| 3,618,047 | 11/1971 | Hertz | 340/347 DD |
| 3,705,299 | 12/1972 | Bastian | 235/311 |

OTHER PUBLICATIONS

Paadnis, "Computer Design", Dec. 1978, pp. 94,96,98,103.

Bredson, "Computer Design", May 1974, pp. 104,106,107,108.

Chen, "Communication of the ACM", vol. 18, No. 1, Jan. 1975, pp. 49-52.

Lengyel, "IBM Technical Disclosure Bulletin", vol. 9, No. 10, Mar. 1967, p. 1347.

Primary Examiner—Charles D. Miller
Attorney, Agent, or Firm—Charles J. Fassbender; J. Ronald Richbourg; Kevin R. Peterson

[57] ABSTRACT

Disclosed is a circuit for transforming digital input signals representing several digits within a binary coded decimal (BCD) address into digital output signals for addressing a binarily addressable memory. One portion of the circuit concatenates the three least significant bits of each digit of those input signals whose most significant bit is a logical "0", and concatenates only the least significant bit of each digit of those input signals whose most significant bit is a logical "1". Another portion of the circuit simultaneously generates a predetermined code that is representative of the most significant bits of all of the digits of the input signals.

6 Claims, 5 Drawing Figures

| | A | E | I | a | b | c | d | e | f | g | h | i | j |
|---|---|---|---|---|---|---|---|---|---|---|---|---|---|
| 41 | 0 | 0 | 0 | 0 | B | C | D | F | G | H | J | K | L |
| 42 | 0 | 0 | 1 | 1 | 0 | 0 | B | C | D | F | G | H | L |
| 43 | 0 | 1 | 0 | 1 | 0 | 1 | B | C | D | H | J | K | L |
| 44 | 1 | 0 | 0 | 1 | 1 | 0 | D | F | G | H | J | K | L |
| 45 | 0 | 1 | 1 | 1 | 1 | 1 | 0 | 0 | B | C | D | H | L |
| 46 | 1 | 0 | 1 | 1 | 1 | 1 | 0 | 1 | D | F | G | H | L |
| 47 | 1 | 1 | 0 | 1 | 1 | 1 | 1 | 0 | D | H | J | K | L |
| 48 | 1 | 1 | 1 | 1 | 1 | 1 | 1 | 1 | ∅ | ∅ | D | H | L |

| | A | E | I | a | b | c | d | e | f | g | h | i | j |
|---|---|---|---|---|---|---|---|---|---|---|---|---|---|
| 51 | 0 | 0 | 0 | 0 | B | C | J | F | G | K | D | H | L |
| 52 | 0 | 0 | 1 | 1 | 0 | 0 | B | C | G | F | D | H | L |
| 53 | 0 | 1 | 0 | 1 | 0 | 1 | B | C | J | K | D | H | L |
| 54 | 1 | 0 | 0 | 1 | 1 | 0 | J | F | G | K | D | H | L |
| 55 | 0 | 1 | 1 | 1 | 1 | 1 | 0 | 0 | B | C | D | H | L |
| 56 | 1 | 0 | 1 | 1 | 1 | 1 | 0 | 1 | G | F | D | H | L |
| 57 | 1 | 1 | 0 | 1 | 1 | 1 | 1 | 0 | J | K | D | H | L |
| 58 | 1 | 1 | 1 | 1 | 1 | 1 | 1 | 1 | ∅ | ∅ | D | H | L |

CIRCUIT FOR ADDRESSING BINARILY ADDRESSABLE MEMORIES WITH BCD ADDRESSES

BACKGROUND OF THE INVENTION

This invention relates to digital memories, and more particularly to circuits and methods for addressing binarily addressable digital memories with a binary coded decimal (BCD) address. Basically, a BCD address consists of a plurality of digits; and each of the digits consists of four bits. Those four bits have states of 0000, 0001 ... 1001. All of the states above 1001 (i.e., 1010–1111) are undefined and do not occur. By comparison, the address inputs of a binarily addressable memory have no undefined states. That is, the address inputs of a binary addressable memory can vary from 000 ... 0 to 111 ... 1.

In the prior art when BCD addresses were utilized to address a binarily addressable memory, the BCD address was first sent through a BCD to binary converter. Then the binary output of the converter was utilized to address the memory. This is illustrated in FIG. 1. Specifically in that figure, the symbols D1–D6 indicate the various digits of the BCD address, letters A–L represent the bits in digits D1–D6, reference numeral 10 indicates the BCD to binary converter, and reference numeral 11 indicates the binarily addressable memory.

Included within the BCD to binary converter 10 are a plurality of binary adders 12–16, and a plurality of single digit decimal to binary encoders 17–21. Encoder 17 operates to encode digit D2 into the binary equivalent of a decimal 10, 20, ... 90; encoder 18 operates to encode digit D3 into the binary equivalent of a decimal 100, 200, ... 900; etc. All of the outputs of the encoders are summed by the adders 12–16 to obtain an address on a bus 22 which is the binary equivalent of the BCD address D6-D1. Data is sent on a bus 23 between the addressed memory location and the digital system 24 which formed the BCD address.

One problem with the above prior art circuit is that its operation is inherently slow. This is because the BCD memory address signals must pass through several levels of logic before they are converted to binary. For example, digit D3 must pass through components 18, 13, 15 and 16. Typically, the time required for all of the BCD signals to pass through converter 10 is so large that the digital system 24 must extend its normal cycle time whenever it addresses the memory 11.

Another problem with the FIG. 1 circuit is that it requires a substantial amount of logic circuitry for its implementation. This, of course, is undesirable since it adds to the cost of the system. For example, each of the components 12–21 typically are comprised of several semiconductor chips.

Also, the large amount of circuitry involved in converter 10 adds to the systems complexity thereby making it difficult to debug. For example, if adder 15 fails to propagate an internal carry, that problem would be difficult to isolate since the inputs to the adder are not formed directly but instead are dependent upon the various logical operations that are performed by components 12, 13, 17, 18 and 19.

Accordingly, it is a primary object of the invention to provide an improved circuit for addressing memories with a BCD address.

Another object of the invention is to provide a BCD memory addressing circuit having improved operating speed.

Another object of the invention is to provide a BCD memory addressing circuit that is implemented with only a minimal amount of logic.

BRIEF SUMMARY OF THE INVENTION

These and other objects are accomplished in accordance with the invention by a circuit which receives input signals representing several digits within a BCD address, and which transforms those signals into digital output signals which are not the binary equivalent of the BCD input address. Those output signals can then be used directly to address a binarily addressable memory. One preferred embodiment of the circuit receives input signals representing three BCD digits, converts those signals in only one level of logic, and is suitable for implementation on a single semiconductor chip.

That preferred embodiment consists of six 8×1 digital multiplexers and one logical "OR" gate. Each of the multiplexers have their data inputs coupled in a predetermined manner to receive logical "1" signals, logical "0" signals, and some of the three least significant bits of each BCD digit. The particular data input which is transferred to each multiplexer's output is determined by the state of the most significant bits of all of the BCD input digits. Those most significant bits are also "OR'd" together by the "OR" gate.

In operation, the concatenated outputs of the multiplexers and the "OR" gates form the output signals for addressing the binarily addressable memory. Those concatenated outputs equal the three least significant bits of each BCD digit of the input signals whose most significant bit is a logical "0", the least significant bit of each BCD digit of the input signals whose most significant bit is a logical "1", and a code which is representative of the most significant bits of all of the BCD digits in the input signals.

BRIEF DESCRIPTION OF THE DRAWINGS

Various features and advantages of the invention will best be understood by reference to the following Detailed Description and accompanying drawings wherein.

DETAILED DESCRIPTION

Figure 2:
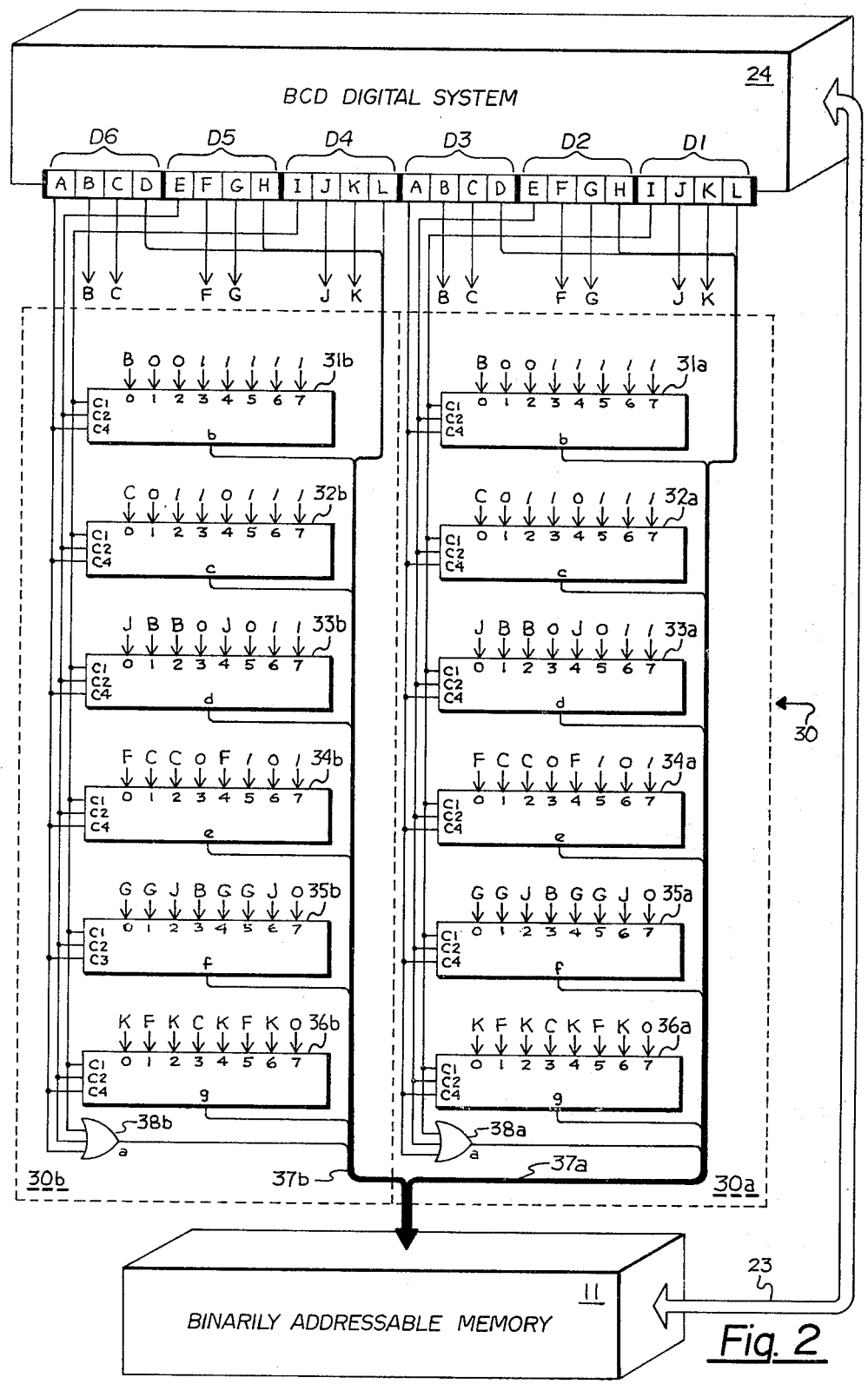
FIG. 2 is a detailed logic diagram of one preferred embodiment of the invention.

Referring now to FIG. 2, there is illustrated a detailed logic diagram of one preferred embodiment 30 of the invention. This embodiment is divided into two symmetrical portions 30a and 30b. Portion 30a receives digital input signals A–L of three binary coded decimal digits D1, D2, and D3; whereas portion 30b receives digital input signals A–L of three other binary coded decimal digits D4, D5, and D6. The digits D1–D6 together are formed within the digital system 24 as a BCD address for the binarily addressable memory 11.

Included within portion 30a are six digital multiplexers 31a-36a. Each of these multiplexers has eight data inputs. They are indicated by arrows numbered 0-7 in FIG. 2 which enter at the top portion of the multiplexer symbol. These data inputs are selected by control inputs C1, C2, and C4 which enter at the left of the multiplexer symbol. The number of the particular data input which is selected is equal to the binary sum of the control inputs C1, C2, and C4. Thus the multiplexers select data input number 1 when C1, C2, and C4 equal 1,0,0; select data input number 5 when C1, C2, and C4 equal 1,0,1; etc.

Each multiplexer output forms one bit of a ten bit output bus 37a. Three other bits in this bus are formed directly by signals D, H, and L. The remaining bit in bus 37a is formed by a logical "OR" gate 38a which receives signals A, E, and I as its inputs. Signals on bus 37a are labeled a-j.

Similarly, circuit portion 30b includes multiplexers 31b-36b, an output bus 37b, and a logical "OR" gate 38b. These components are interconnected to operate on the signals A-L of digits D4, D5, and D6 in the same manner which components 31a-38a operate on signals A-L of digits D1, D2, and D3. All of the signals on output buses 37a and 37b together form the address for memory 11.

Figures 3, 4, 5:
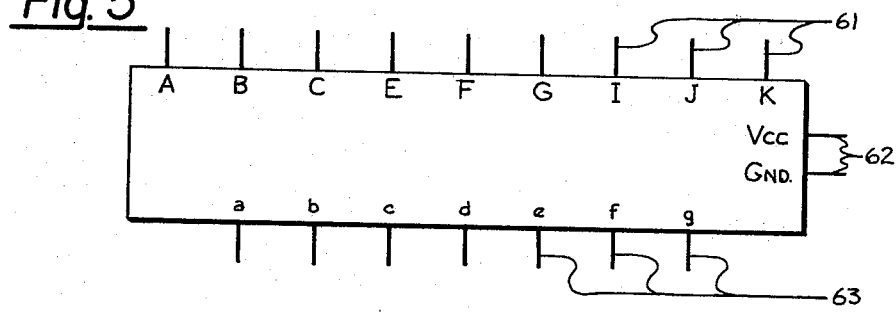
FIG. 3 is a truth table which aids in explaining the operation of the FIG. 2 circuit.
FIG. 4 is another truth table which further explains the operation of the FIG. 2 circuit.
FIG. 5 is a block diagram of a chip layout for the FIG. 2 circuit.

To understand the theory of how the disclosed memory addressing system operates, reference should now be made to FIG. 3. In that figure, letters A-L again represent the bits which comprise three binary coded decimal digits, and the letters again a-j represent the ten bits which comprise one of the digital output buses 37a or 37b.

Consider now the condition where the signals A, E, and I are all logical "0's". This condition is indicated in row 41. Under those conditions, any one of the three least significant bits of each digit can be either a "0" or a "1". In other words, each of the three least significant bits contain information; and this information is mapped onto the ten outputs a-j. Row 41 indicates one such mapping.

Next consider the condition where the most significant bit of only digit D1 is a logical "1". This is indicated in row 42. Under those conditions, bits J and K must be 0, and only bit L can vary. Thus, bits J and K contain no information and can be ignored. This leaves only bit L to be mapped onto one of the outputs a-j. Also, since bits A and E are both logical "0's", the corresponding three least significant bits B, C, D, F, G, and H must all be mapped onto the output lines a-j as described above. One such mapping is illustrated in row 42.

Similarly, when the most significant bit E of digit D2 is a logical "1", then bits F and G can be ignored because only bit H contains information. This is indicated by the mapping in row 43. Also, when bit A is a logical "1", bits B and C contain no information and only bit D must be mapped onto the output bus as is indicated in row 44.

Next, consider the condition where two digits simultaneously have their most significant bit equal to 1. This condition is indicated in rows 45, 46, and 47. For example, in row 45, bits E and I both equal a logical "1" and thus bits F, G, J, and K contain no information and can be ignored. That leaves only bits B, C, D, H, and L to be mapped onto the output bus.

Similarly, when all three of the digits have their most significant bits equal to 1, then bits B, C, F, G, J, and K can all be ignored. This leaves only the least significant bits of D, H, and L to be mapped onto the output bus as indicated in row 48.

Up to this point, only the three least significant bits of the binary coded decimal digits have been mapped onto the output bus. However, as indicated in FIG. 3, a predetermined code is also appended to these mapped bits. The sole requirement of this code is that it retains the information which is contained in the most significant bit of each digit. For example in the code depicted in FIG. 3, the condition a=0 indicates that bits A, E, I, respectively equal 0,0, and 0; and a code of abcde=11111 indicates that bits A, E, I, respectively equal 1, 1, 1. As alternatives however, the code may use any larger number of bits to retain the information in the most significant bit of each digit.

Note that in FIG. 3 every one of the j outputs is the same (i.e., it always equals L). This is desirable since the implementation requires only a conductive lead, as opposed to a logical multiplexer. Thus, the logic circuitry which is required to implement the truth table of FIG. 3 may be simplified by rearranging the signals in the various rows such that all of the signals under one particular column are the same.

One such rearrangement is indicated by the truth table of FIG. 4. In that table, row 51 was obtained by interchanging signals H and K, and J and D in row 41. Those same signals were also interchanged in rows 43, 44, and 47. Similarly, signals D and G were interchanged in rows 43 and 46.

Compare now the truth table of FIG. 4 with the previously described logic diagram of FIG. 2. By inspection it can be seen that "OR" gate 38a implements the truth table output of column "a"; multiplexer 31a implements the truth table output of column "b"; multiplexer 32a implements the truth table output of column "c"; etc. Also, the h, i, j truth table outputs are implemented merely by three conductors which pass signals D, H, and L through bus 37a.

Figure 1:
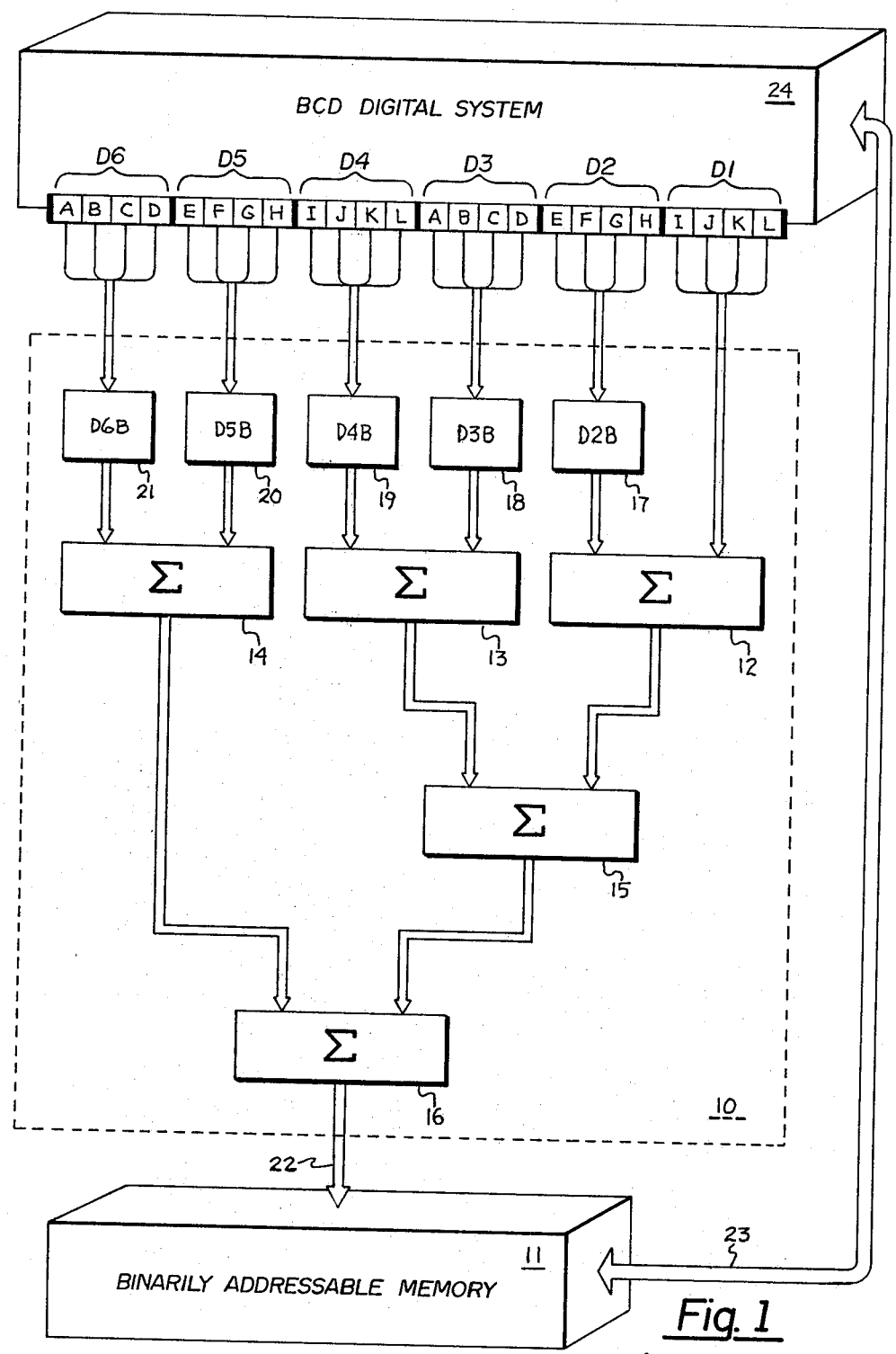
FIG. 1 is a block diagram of a prior art circuit for addressing a binarily addressable memory with a BCD address.

Clearly, the above disclosed memory addressing circuit is substantially faster in operation then the prior art memory addressing system of FIG. 1. This is because each of the signals in the output buses 37a and 37b are formed by passing through only either a multiplexer or an "OR" gate. By comparison, the signals which address the memory in the prior art system of FIG. 1 are required to pass through several levels of logic.

Another attractive feature of the circuit which is defined by the truth table of FIG. 4 and which is illustrated in FIG. 2, is that it can be implemented with a single 18 pin semiconductor chip. FIG. 5 is a block diagram illustrating the input pins 61, the voltage pins 62, and the output pins 63 of that chip. Note that in this chip, inputs need not be provided for the signals D, H, and L; and outputs need not be provided for signals h, i, and j. Of course a more generalized chip could be constructed which also input and output those signals; but such a chip would require six extra pins which is undesirable.

Still another attractive feature of the circuit which is defined by the truth table of FIG. 4 is that it makes very efficient use of memory 11. That is to say, the circuit forms almost all of the binary memory addresses which exist. Those binary memory addresses which are not formed are indicated in row 58 by the don't care symbols $\phi$. By inspection, it can be seen that only twenty-four of the one-thousand twenty-four possible binary addresses are not formed. This yields an efficiency of 97.6%.

One preferred embodiment of the invention has now been described in detail. In addition, many changes and modifications can be made to those details without departing from the nature and spirit of the invention. For example, while circuit portions 30a and 30b of FIG. 2 each operate on BCD signals representing three digits, they may also be modified to operate on either more or fewer digits. The logical requirements for such a circuit would be defined by a truth table similar to that illustrated in FIG. 3 but wherein the right most column lists all of the possible combinations for the most significant bit of each digit, and wherein the left most column indicated a mapping of the three least significant bits in each digit as was previously described.

As another modification, it is to be understood that any pair of bits within any row of the FIG. 3 or FIG. 4 truth tables may be interchanged. For example in FIG. 3, all of the entries of column "a" could be interchanged with the corresponding entries in column "j". Thus the code which is generated as being representative of the state of the most significant bit of each BCD digit may be either right justified as illustrated in FIG. 3, or left justified, or not justified at all.

Accordingly, since many such modifications may be made, it is to be understood that the invention is not limited to those details which are illustrated in the figures but are defined by the appended claims.

What is claimed is:

1. The combination of a digital system means for providing electrical signals encoded as any number of BCD digits greater than three, a memory means that is addressable with electrical signals encoded as a binary address, and a means for generating said electrical signals that address said memory means from said electrical signals provided by said digital system means; said generating means being comprised of:
a plurality of identical circuit modules, the number of modules in said plurality being at least one-third the number of BCD digits encoded into said electrical signals from said digital system;
each of said modules having inputs coupled to receive a respective subset of said electrical signals from said digital system, said subset of electrical signals encoding up to three BCD digits;
each of said modules including a means for forming electrical output signals as a permutation of:
  (a) those electrical signals in said subset that represent the three least significant bits of each BCD digit having a most significant bit of "0",
  (b) those electrical signals in said subset that represent the single least significant bit in each BCD digit having a most significant bit of "1", and
  (c) encoded digital "1" and "0" signals that represent the most significant bits of all of the BCD digits encoded into all of the electrical signals in said subset; and
means for addressing said memory by concatinating together said electrical output signals from all of said modules as a single binary address.

2. The combination according to claim 1 wherein said means for forming said electrical output signals in each of said modules includes a multiplexor means for forming at least six of said electrical output signals in said permutation by selecting digital "1" signals, digital "0" signals, and one portion of said electrical signals in said subset in response to another portion of said electrical signals in said subset.

3. The combination according to claim 2 wherein said multiplexor means in each of said modules selects said one portion of said electrical signals in response to those electrical signals in said subset that represent the most significant bit of each BCD digit encoded into all of the electrical signals in said subset.

4. The combination according to claim 3 wherein said one portion of said electrical signals consists of those electrical signals in said subset that represent the two bits of middle significance of each BCD digit encoded into all of the electrical signals in said subset.

5. The combination according to claim 4 wherein said means for forming further includes an OR-gate means for forming one of said output signals in said permutation by logically OR-ing together those electrical signals in said subset that represent the most significant bit of each BCD digit encoded into all of the electrical signals in said subset.

6. The combination according to claim 5 wherein said means for forming further includes three conductor means for forming three of said output signals in said permutation directly from, and without any transformation of, those electrical signals in said subset that represent the least significant bit of each BCD digit encoded into all of the electrical signals in said subset.

* * * * *